(12) United States Patent
Kendall

(10) Patent No.: US 7,019,324 B2
(45) Date of Patent: Mar. 28, 2006

(54) STRONGLY TEXTURED ATOMIC RIDGE AND DOT MOSFETS, SENSORS AND FILTERS

(75) Inventor: Don Kendall, Albuquerque, NM (US)

(73) Assignee: Starmega Corporation, Albuquerque, NM (US)

( * ) Notice: Subject to any disclaimer, the term of this patent is extended or adjusted under 35 U.S.C. 154(b) by 0 days.

(21) Appl. No.: 10/267,665

(22) Filed: Oct. 10, 2002

(65) Prior Publication Data

US 2003/0127692 A1 Jul. 10, 2003

Related U.S. Application Data

(62) Division of application No. 09/658,599, filed on Sep. 8, 2000, now Pat. No. 6,509,619.

(60) Provisional application No. 60/153,088, filed on Sep. 10, 1999.

(51) Int. Cl.
*H01L 29/06* (2006.01)

(52) U.S. Cl. .......................................... 257/14; 257/24

(58) Field of Classification Search .................. 257/14, 257/24

See application file for complete search history.

(56) References Cited

U.S. PATENT DOCUMENTS

| | | | |
|---|---|---|---|
| 4,983,540 A | 1/1991 | Yamaguchi et al. |
| 4,987,094 A | 1/1991 | Colas et al. |
| 5,126,574 A | 6/1992 | Gallagher |
| 5,258,326 A | 11/1993 | Morishima et al. |
| 5,296,719 A | 3/1994 | Hirai et al. |
| 5,300,452 A | 4/1994 | Chang et al. |
| 5,360,978 A | 11/1994 | Gueret |
| 5,372,675 A | 12/1994 | Wakabayashi et al. |
| 5,482,890 A | 1/1996 | Lin et al. |
| 5,567,954 A | 10/1996 | Dobson et al. |
| 5,612,255 A | 3/1997 | Chapple-Sokol et al. |
| 5,976,444 A | 11/1999 | Pearson et al. |

OTHER PUBLICATIONS

Kendall, Don L., "Far Beyond Microelectronics with Silicon (Top Ten Speculations from Bulk Micromachining).".

*Primary Examiner*—Douglas A. Wille
(74) *Attorney, Agent, or Firm*—Jagtiani & Guttag

(57) ABSTRACT

The present invention provides a MOSFET device comprising: a substrate including a plurality of atomic ridges, each of the atomic ridges including a semiconductor layer comprising Si and an dielectric layer comprising a Si compound; a plurality nanogrooves between the atomic ridges; at least one elongated molecule located in at least one of the nanogrooves; a porous gate layer located on top of the plurality of atomic ridges. The present invention also provides a membrane comprising: a substrate; and a plurality of nanowindows in the substrate and a method for forming nanowindows in a substrate.

13 Claims, 5 Drawing Sheets

STRONGLY TEXTURED ATOMIC RIDGE AND DOT MOSFETS, SENSORS AND FILTERS

CROSS-REFERENCE TO RELATED APPLICATIONS

This application is a divisional of U.S. patent application Ser. No. 09/658,599, entitled "STRONGLY TEXTURED ATOMIC RIDGE AND DOT MOSFETS, SENSORS, AND FILTERS," filed Sep. 8, 2000, now U.S. Pat. No. 6,509,619 B1, issued Jan. 21, 2003, which claims the priority of U.S. Provisional Patent Application No. 60/153,088, filed Sep. 9, 1999, the entire disclosure and contents of which are hereby incorporated by reference. This application also makes reference to the following U.S. patent applications: U.S. patent application Ser. No. 09/187,730, entitled "ATOMIC RIDGES AND TIPS," filed Nov. 9, 1998, now U.S. Pat. No. 6,667,492 B1, issued Dec. 23, 2003, U.S. patent application Ser. No. 09/657,533, entitled "STRONGLY TEXTURED ATOMIC RIDGE AND DOT FABRICATION," filed Sep. 8, 2000, now U.S. Pat. No. 6,413,880 B1, issued Jul. 2, 2002, and U.S. patent application Ser. No. 09/658,878, entitled "STRONGLY TEXTURED ATOMIC RIDGES AND TIP ARRAYS," filed Sep. 9, 2000, now U.S. Pat. No. 6,465,782 B1 issued Oct. 15, 2002, the entire disclosure and contents of which are hereby incorporated by reference.

BACKGROUND OF THE INVENTION

1. Field of the Invention

The present invention relates to MOSFET sensors, filters and nanostructures.

2. Description of the Prior Art

A problem with many conventional nano-sized chemical sensors is that they do not have a high specificity for particular chemical species to be detected. For example, MOSFETs, or more precisely, ISFETs (Ion Sensitive Field Effect Transistors), may be provided with porous gates to allow the environmental gases to arrive at the gate/dielectric interface and modify the threshold voltage and current voltage character. In fact, these ISFETs are often quite sensitive to gaseous ambients of different types. However, the electrical behavior of the ISFET does not generally allow different gases to be distinguished from each other, especially when there are several gases present in the environment simultaneously.

Similar to the problems faced in producing high specificity nano-sized chemical sensors, there is also currently no good way to produce very high flow-through nano-sized reaction chambers or chemical filters having a high degree of chemical specificity. For example, people having an oxygen deficiency often carry around a bulky oxygen tank which must be refilled on a regular basis. A lightweight active filter that allowed the passage of oxygen and very little nitrogen and larger dust and pollen particles would be a significant adjunct to the quality of life for many people The present methods of electron beam lithography being developed at great expense may reach an ultimate minimum dimension of about 35 nm, which is indeed a large improvement over the 180 nm now being produced in the IC business. One of the best developed methods in this family is called SCALPEL (SCattering with Angular Limitation Projection Electron-beam Lithography). This system requires magnetic lenses, very thin masks, difficult mask alignment tools, and is quite complex. It appears to have significant promise in high throughput lithography for minimum dimensions down to about 35 nm, but not for smaller dimensions. A simple contact mask for e-beam lithography producing dimensions in the range of 1 to 5 nm would be of major benefit for a wide range of applications.

SUMMARY OF THE INVENTION

It is therefore an object of the present invention to provide MOSFETs that may be used in producing sensors having a high degree of chemical specificity.

It is another object of the present invention to produce nano-sized reaction chambers having a high degree of chemical specificity.

It is yet another object of the present invention to produce nano-sized filters having a high degree of chemical specificity.

It is yet another object of the present invention to produce nano-sized openings in a contact lithographic mask and a shadow mask for charge and neutral particles.

According to first broad aspect of the present invention, there is provided a MOSFET device comprising: a substrate including a plurality of atomic ridges, each of the atomic ridges including a semiconductor layer comprising Si and an dielectric layer comprising a Si compound; a plurality nanogrooves between the atomic ridges; at least one elongated molecule located in at least one of the nanogrooves; a porous gate layer located on top of the plurality of atomic ridges.

According to a second broad aspect of the present invention, there is provided a thin membrane comprising: a substrate; and a plurality of nanowindows in the substrate.

According to a third broad aspect of the present invention, there is provided a method for forming nanowindows in a substrate comprising the steps of: forming convex depressions having bottoms on a surface of a Si substrate; treating the bottoms of the convex depressions to form atomically flat regions; ion-implanting at least one element selected from the group of elements consisting of oxygen and nitrogen into the Si substrate to form a lower layer comprising Si, a middle layer comprising a Si-based insulating compound, and an upper layer comprising single crystalline Si; thinning the upper layer to a thickness of 5.0 to 50.0 nm; depositing nanowires comprised of a first metal on the atomically flat regions; and etching away portions of the substrate that are unprotected by the nanowires to form a plurality of nanowindows in the substrate, wherein the nanowindows have a pitch of 0.94 to 5.35 nm and window widths of about 0.2 to 5.0 nm.

Other objects and features of the present invention will be apparent from the following detailed description of the preferred embodiment.

BRIEF DESCRIPTION OF THE DRAWINGS

The invention will be described in conjunction with the accompanying drawings, in which.

DETAILED DESCRIPTION OF THE PREFERRED EMBODIMENT

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, the term "monolayer (ML)" refers to one atomic layer of metal on a surface of a given orientation.

For the purposes of the present invention, the term "Ultra High Vacuum (UHV)" refers to a pressure of less than $1 \times 10^{-9}$ Torr.

For the purposes of the present invention, the term "Reactive Ion Beam Etching (RIBE)" refers to one of the plasma or dry-etching methods that may be used to produce the grooves of this invention.

For the purposes of the present invention, the term "surfactant restructurant" refers to a single element or several elements that help restructure the surface of a substrate used in the formation of grooves, ridges, tips, oxide ridges, quantum wires, or other structures of the present invention.

For the purposes of the present invention, the term "nanowire" refers to an overlayer row resulting from the deposition of a metal on the silicon surface. Such a nanowire has a width of ~1 to 4 nm, a length of 10 nm or longer, and a pitch of ~1 to 5 nm.

For the present invention the term "pitch" refers to the separation between two adjacent nanowires, atomic ridges or grooves.

For the purposes of the present invention, the term "atomic ridge" refers to a ridge formed in the silicon wafer, primarily from an etching procedure following the growth of nanowires.

For the purposes of the present invention, the term "Molecular Beam Epitaxy (MBE)" refers to the deposition of elements onto a substrate using evaporators in a UHV environment.

For the purposes of the present invention, the term "nanogroove" refers to the recessed region between two adjacent atomic ridges.

For the purposes of the present invention, the term "nanowindow" refers to a nanogroove that goes all the way through a membrane, and it may be an open window or may in some cases have a thin dielectric layer in the window.

For the purposes of the present invention, the term "nanoborder" refers to one or more nanowires or nanoridges bordering a nanowindow.

For the purposes of the present invention, the term "long chain molecule" refers to molecules having a length of at least 5 nm, but generally refers to much longer molecules or segments of very long molecules. The term long chain molecules includes DNA, RNA, polypeptides, etc.

For the purposes of the present invention, the term "elongated molecule" includes elongated molecules such as long chain molecules, carbon nanotubes, etc.

For the purposes of the present invention, the term "etch mask" refers to any material that resists or locally slows the wet or dry (plasma) etching process.

Description

Figure 1:
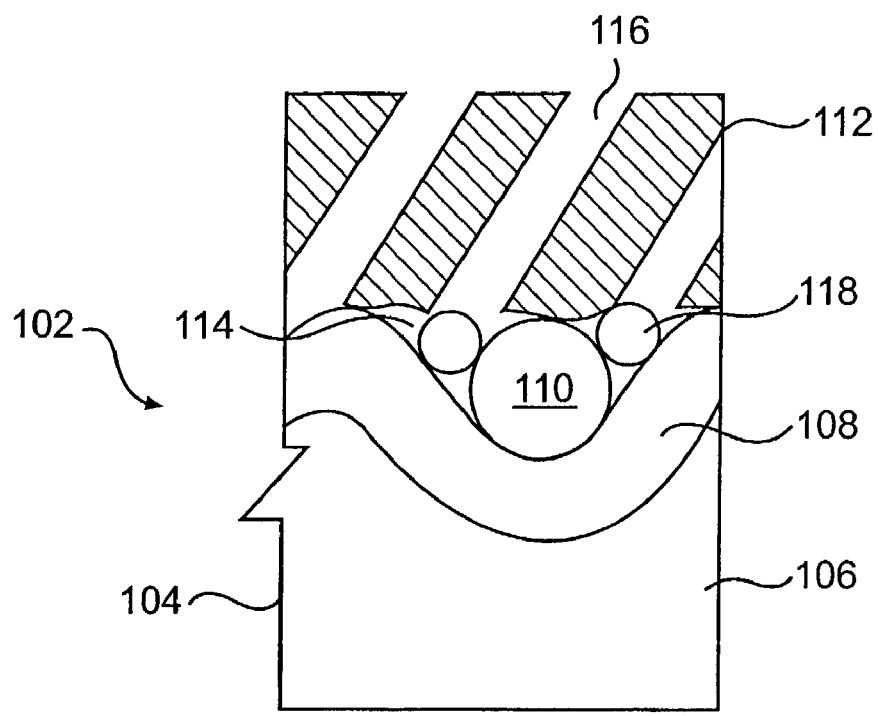
FIG. 1 illustrates a first embodiment of the MOSFET device in cross section of the present invention in simplified form.

Molecules of a particular size may move into and out of gap under a "suspended" metal gate shown in FIG. 1. Different oxide modulation widths, depths, and perhaps surface treatments of these gaps, along with different metal gate porosities obtaining using different oblique angle evaporation, along with nanotubes and other long molecules or segments thereof, may give a very large amount of specificity to the MOSFET device character for gaseous and liquid detection. Good specificity is very important for chemical sensors, and the concept of gangs of different length MOSFETs having different width, depth and gap characteristics may be used to analyze complex mixtures of chemicals. A MOSFET of the present invention includes a porous metal gate with pores that have similar but not identical diameters. The pore size may be controlled over a wide range by varying the angle of obliquity of the evaporant, the temperature of the receiving substrate, the rate of evaporation, and the rate of rotation of the substrate during the deposition process. See K. Robbie, et al, J. Vac. Sci. Tech. B, 16(3), 1115–1122 (1998) for experimental data on the porosity of thin films evaporated under a wide range of conditions.

A gated single walled nanotube (SWNT) of carbon supported on an $SiO_2$ substrate has been shown to be extremely sensitive to $NH_3$ and $NO_2$ gas molecules, see Kong et al. "Nanotube molecular nanowires as chemical sensors", in *Science*, 287, 622–625 (2000), the entire disclosure and contents of which is hereby incorporated by reference. Two and three magnitude changes in the current of a MOSFET-like structure were obtained when the nanotube was exposed to these gases while using different "gate voltages" obtained by biasing the substrate relative to the source and drain metal nanowires on the covering oxide. The present invention provides a ridged or dot MOSFET having a suspended porous gate which may have the effective work function of the gate modified with gas molecules or with SWNTs stretched out by the millions in the undulations of the oxide.

The atomic ridges of the present invention may be formed by any appropriate process for forming atomic ridges described in the 1998 U.S. patent application Ser. No. 09/187,730 entitled "Quantum Ridges and Tips" and in the concurrently filed U.S. patent application entitled "Strongly Textured Atomic Ridge and Dot Fabrication". Both of these applications list Don L. Kendall as an inventor and the contents and disclosure of both these applications are hereby incorporated by reference.

In one preferred method for forming atomic ridges of the present invention, a simple oblique incidence evaporation of an etch resistant metal onto a pristine silicon surface under Ultra High Vacuum UHV conditions is conducted. The oblique incidence evaporation is then followed by a brief etching step (dry or wet). Other single crystal materials other than silicon may also be used for the substrate, for example, Ge, diamond, and the III–V compounds, as well as other compounds and even metal crystals.

For preparing atomic ridge products of the present invention, a substrate, preferably a semiconductor wafer, most preferably a circular Si (1 1 X) wafer, is prepared by standard chem-mechanical polishing methods. When the substrate is a silicon wafer, the substrate is preferably heated in a UHV chamber at a pressure of about $10^{-10}$ Torr to a temperature of 1150° C. for a brief period ("flashed") to remove any surface oxides and then cooled to below room temperature (around −20 to 25° C.). The heating of the wafer may also be accomplished locally using a focused or beam-expanded laser passing through a quartz window in the molecular beam epitaxy (MBE) system. This heating process leaves the surface in a stable condition with slightly elevated parallel atomic ridges or misalignment steps having a pitch of 0.54 to 60 nm, most preferably 0.94 to 5.4 nm for surfaces of (1 1 2) to (5 5 12), respectively. The atomic ridges may have occasional atomic steps in them along their length due to the slight variations from perfect flatness of the wafer surface, but after each misalignment step, the ridges again establish themselves in the same <1 1 0> direction. In addition, there may be occasional reconstruction faults in the surface, especially on the (5 5 12) surface. By contrast the (1 1 4), (7 7 15), and (5 5 11) surfaces are generally completely free of restructuring faults.

The substrate is then coated to form quantum wires on the ridges. A preferred technique for forming quantum wires is to use oblique evaporation at a small angle of 1 to 5° (or up to 30 degrees is effective in some cases) with an etch resistant (or in certain quantum wire applications "conductive") metal such as Au or Cr, or Al or Be so that the slightly higher (by about 3 Å) ridges are coated preferentially with 5 to 30 Å of the metal relative to the intervening very shallow trough of the restructured clean surface. Preferably, the substrate is rotated during this process while maintaining the obliquity to improve the uniformity of coverage along the ridges. This rotation also helps to avoid bridging of the metal due to the "lateral needles" that form when evaporating at high obliquity. This rotation may be modified by blocking off the evaporating beam with a raised barrier on the sample holder or on the wafer itself along the direction of the atomic ridges so that the evaporation source never is in direct line with the atomic troughs.

An alternative method for forming atomic ridges for use in the present invention involves depositing nanowires of Ag or Au on a Si substrate. This process preferably starts with a high temperature, on the order of 1100–1200° C., treatment of a special orientation wafer such as Si(7 7 15), Si(5 5 11) or Si(5 5 12) in an Ultra High Vacuum (UHV) system. The wafer is then cooled at a slow rate to near room temperature (RT), at which point a fraction of an atomic monolayer, ML, of an element such as Au, Ag, Ga, etc. is evaporated onto the wafer. The wafer is then heated to a specific temperature range, depending on the element deposited, the thickness of the element to be deposited, and the substrate on which the element is deposited. As a result of the heat treatment, nanowires are formed of the deposited element.

After the metal nanowires are formed on an Si wafer, additional treatments to the Si wafer are used to produce grooves in the unprotected Si between the metal nanowires, thereby producing atomic ridges. Depending on the application, the metal nanowires may be removed from the atomic ridges.

In one preferred embodiment, the additional treatment of the Si wafer includes thickening or protecting the thin metal nanowires to make the metal nanowires more etch resistant during various conventional wet chemical or dry etching treatments. Once the metal nanowires have been thickened, the Si wafer is etched to produce grooves having a pitch of 0.94 to 5.35 nm.

A method of depositing Ag on a Si(5 5 12) surface suitable for use in the method of the present invention is described in Baski et al., *J. Vac. and Tech.* 17, 1696–1699 (1999), the entire disclosure and contents of which is hereby incorporated by reference. The process of Baski et al. starts with a clean well-polished single crystal wafer of Si(5 5 12). The wafer is then heated to 1150–1200° C. in a UHV system operating at a pressure of about $10^{-10}$ torr to vaporize or flash any native oxide and to allow the surface to restructure into the well-ordered structure characterized by a surface unit cell of 5.35 nm. The wafer is then slowly cooled to room temperature, and very thin layer of only about 0.25 monolayers (ML) of Ag is evaporated from a tungsten filament onto a wafer. The sample is then heated at a pressure of about $10^{-10}$ torr to about 450° C., at which temperature the Ag atoms move around on the surface and form Ag nanowires of about 1.6 nm width on a pitch of 5.35 nm, namely on the spacing of the surface cell mentioned above. This is similar to the process for the deposition of Au on such as surface described in U.S. patent application Ser. No. 09/187, 730 filed Nov. 9, 1999, the entire contents and disclosure of which is hereby incorporated by reference.

In the method of the present invention, when Ag nanowires are deposited, preferably the Ag is deposited to a thickness of 0.15 to 2.5 ML on a Si substrate. In the method of the present invention, when Au induced restructuring is desired, preferably the Au is deposited to a thickness of 0.04 to 1.0 ML on a Si substrate.

When silver is the metal deposited as nanowires, the deposited silver nanowires may be used as etch masks for etching Si, either with wet chemistry or dry etching. Preferably, the Ag nanowires are thickened by depositing more Ag or Au, or other materials to make the nanowires more robust etch mask. When the Ag nanowires are thickened with Ag, the resulting thickened nanowires preferably have a thickness of about 3 to 5 ML. When the Ag nanowires are thickened with Au, the resulting thickened nanowires preferably also have a thickness of about 3 to 5 ML, although thicknesses up to at least 20 ML are possible for both Au and Ag thickening using oblique evaporation along with a rotating substrate. A Cu or Au-coating completely covering the Ag nanowires allows UHV samples to be taken out into normal room ambient temperature for subsequent processing.

Without pre-stressing of the substrate on which Ag is deposited, there may be occasional surface faults that disrupt the regularity of the atomic ridges for about 20% of the ridges. Occasionally there are extra (3 3 7) segments of 1.6 nm width on the (5 5 12) structure, so the sequence may become something like: 5.4 nm, 5.4 nm, 5.4 nm, 5.4 nm, 5.4 nm, 7.0 nm, 5.4 nm, 5.4 nm, etc. Alternatively, occasionally there are missing 1.6 nm segment so that the sequence may become something like: 5.4 nm, 5.4 nm, 5.4 nm, 5.4 nm, 5.4 nm, 3.8 nm, 5.4 nm, 5.4 nm, etc. However, typically, a sample either has all extra 1.6 nm faults, or it has all missing 1.6 nm segments. This is highly suggestive that mounting samples under compressive stress, or alternatively, tensile stress, during the passage of heating current to raise the samples to 1100 to 1200° C. may remove these faults or control the density of these faults.

Depending on the application, the faults in the Si wafer may be controlled or removed using compression or tension. For example, the surface faults may provide controlled disruption of the Bragg-Law reflections, which provides plateaus that may be desirable in the production of MOSFETs. For other applications, very light compression or tension may be applied to the Si wafer, to eliminate surface faults completely to get large regions of 5.4 nm sequences. One method of controlling such tension or stress involves using quartz wedges during the high temperature flashing process and/or at lower temperatures. Another way to provide a stress-free Si(5 5 12) surface is to float an Si wafer on a molten tin cushion during an MBE/UHV treatment.

The problem of small modulations on the surface of the Si wafer may be addressed in one of at least two ways. One way of solving the problem of small surface modulations is to add concave or convex regions on the (5 5 12) or other (1 1 X) wafers, as described in U.S. patent application Ser. No. 09/187,730, the entire disclosure and contents of which is hereby incorporated by reference.

However, the step of forming concave or convex regions may be avoided for many applications by cutting and polishing the Si(1 1 X) wafer off-axis in particular directions by about 0.5 to 4 degrees. Preferably the angle chosen is larger than the largest local Si wafer undulation angles, thereby ensuring that the misalignment steps will be in the same general directions, though not very regularly spaced nor straight because of the undulations. As Si wafer local flatness improves and as the precision of the original orientation angle improves, the need for off-axis cuts of the Si wafer diminishes.

It should also be noted that purposeful misalignment by less than 0.5 degrees, down to about 0.1 degrees, may also be useful in some applications, since this will result in single monolayer steps. Single monolayer steps may provide greatly different kinetics, compared to the double steps of wafer misorientations greater than about 1.0 degrees, during various processing steps. Crystal cleavage on a perfect crystal plane may be used to eliminate these steps, but this does not occur except on the (1 1 1) or (1 1 0) planes, and doing so on large wafers may be difficult.

An important additional process step may be taken after the original Si etch step of only a few nanometers depth, either using RIBE or wet etching. This additional process step involves an oblique evaporation on a rotating substrate in order to build up a thicker metal or dielectric etch mask of several monolayers. After the additional monolayers are deposited, a second RIBE or other dry etching step may be performed in order to produce significantly deeper grooves of 2.0 to 20.0 nm depth, or even much deeper when the evaporated film is much thicker. This oblique evaporation may also be done on the original Ag deposited surface or even on the surface of a Si(1 1 X) before it has been through the Ag deposition process. However, the original surface topology of 0.2 to 0.3 nm, without the Ag, is quite shallow, and a preferred method is to increase the topology somewhat before the oblique evaporation step. These thicker grooves allow a much wider range of applications.

A fraction of a monolayer (ML) of an element like Ga, a surfactant-restructurant may be applied to the surface of the Si wafer prior to deposition of metal atomic strips to encourage elements such as Au or Ag deposited on the Si wafer to rapidly move to the desired atomic ridge positions.

Depositing a little less than one monolayer of Ga on a (1 1 2) Si wafer may force the Si wafer to favor the (1 1 2) facet formation after a 500° C. treatment rather than a mixture of (3 3 7) and (1 1 1) sawtooth facets that are typically observed on a clean (1 1 2) surface. A (1 1 2) structure generally provides the smallest pitch in the (1 1 X) family in which the nanogroove walls are physically robust. Such reconstructions are described in Baski et al., "The structure of Si(1 1 2)-Ga(Nx1) reconstructions", *Surf. Sci.* 423, L265–270 (1999), the entire contents and disclosure of which is hereby incorporated by reference.

Using 0.04 to 0.12 ML of Au on slightly irregular (5 5 12) shows that Si (5 5 12) surface restructures to many (7 7 15) facets with interposed (1 1 3) steps after heating the wafer at about 800° C. The (7 7 15) atomic ridges have a very regular spacing of 3.45 nm when the Au is present. The situation with (7 7 15) atomic ridges is unlike the situation with (5 5 12) atomic ridges which may as have as many as 20% surface faults. Therefore, precisely aligned (7 7 15) wafers may be produced by Si manufacturing processes and then an 800° C. Au treatment may be applied to obtain large areas of well structured material with very regular spacing of 3.45 nm. To utilize this regular spacing to produce regularly spaced nanogrooves of 3.45 nm pitch may be accomplished by using subsequent oblique evaporation, an electrochemical process, etc. of a metal or other etch mask and a dry or wet etch process to produce the grooves. The above-described restructuring process involves only a single impurity.

Small amounts of either Ga, or even Hg or Sn, used in conjunction with Ag, Au, or Al may also be useful as surfactants. The use of these small quantities of surfactants may lower or broaden the useful heat treatment range, and may help heal irregularities.

An additional aspect of using surfactants like Au at 800° C. or Ga at 500° C., or perhaps Hg at a much lower temperature is to clean or restructure a surface prior to an MBE process at a similar or higher temperature. $H_2$, $O_2$ and cracked $H_2$ may be used for removing nanowires of Ag, Au, Ga etc. from the atomic ridges so they may be used to form MOSFETS.

Nanowires of Ag, Au, Ga, etc. may also be removed form the atomic ridges by wet chemical cleaning using standard processes.

To form a MOSFET of the present invention, an upper dielectric or oxidized layer is formed in a substrate including atomic ridges by heating the wafer in an oxidizing or nitriding atmosphere.

After the dielectric layer is formed on the surface of the substrate, long chain molecules are deposited in nanogrooves between the atomic ridges by any of several methods. For example, the molecules may be suspended in a solvent and allowed to settle into the nanogrooves, perhaps in an electric field to stretch out the molecules in the general direction of the nanogrooves.

To form a MOSFET, after the long chain molecules are placed in the nanogrooves, a porous gate layer comprising an obliquely evaporated metal like Al, Au, Cu, or W is deposited on the wafer. This metal gate layer rides across the top of the atomic ridges to form enclosed regions that contain the long chain molecules. Pores in the porous gate layer allow molecules to enter the MOSFET and be adsorbed or chemically reacted with the long chain molecules in the enclosed regions. Methods of forming MOSFETs are well known in the art, and are described, for example, in U.S. Pat. No. 6,667,492, incorporated above by reference.

FIG. 1 illustrates a section of one embodiment of a MOSFET device 102 of the present invention. MOSFET device 102 includes a substrate 104 including an Si layer 106, and $SiO_2$ dielectric layer 108, a long chain molecule 110, a porous gate layer 112 and an enclosed region 114. Large pores 116 allow large molecules 118, typically 0.7 to 0.9 nm in average diameter to enter enclosed region 114 and be detected by their effect on the conductance of the long chain molecules 110.

Figure 2:
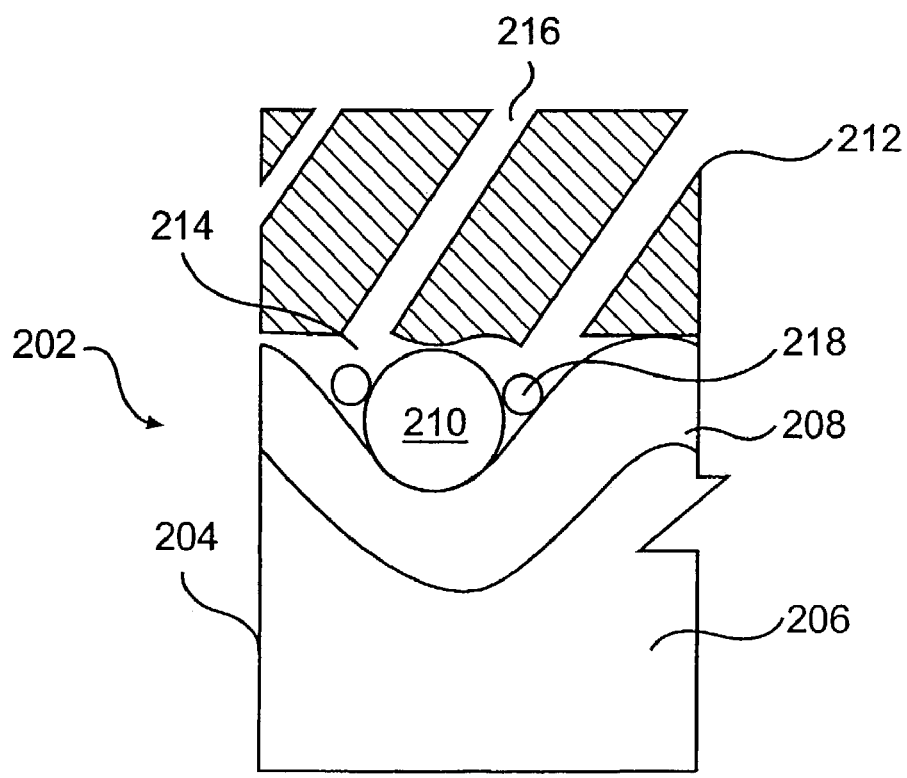
FIG. 2 illustrates a second embodiment of the MOSFET device of the present invention in simplified form.

FIG. 2 illustrates a section of second embodiment of a MOSFET device 202 of the present invention. MOSFET device 202 includes a substrate 204 including an Si layer 206, and $SiO_2$ dielectric layer 208, a long chain molecule 210, a porous gate layer 212 and an enclosed region 214. Small pores 216 allow small molecules 218, typically 0.3 to 0.6 nm in average diameter to enter enclosed region 212 and be detected by their effect on the long chain molecules 210.

A MOSFET of the type shown in either FIG. 1 or FIG. 2 is an excellent structure for sensing gases, as well as ions in liquids.

The spacing between atomic ridges may be 1.63 nm for (1 1 4) surfaces of Si, or it may be 5.4 nm for (5 5 12), as well as many other spacings for other (1 1 X) surfaces. The (5 5 12) surfaces provide larger groove widths, 1.6 to 3.2 nm depending on the depth of the undulations and the oxidation or deposition conditions, that are easily capable of containing the 1.6 to 1.8 nm diameter nanotubes. The oxide thickness may be adjusted to detect different size and shaped molecules.

It is important to note that the MOSFET device of the present invention is similar to a standard MOSFET, except for the STAR ridges, the porous gate, and the deposition in the oxide grooves of nanotubes or other long chain molecules. The current may flow laterally from left to right across the inversion layers of FIG. 1, or it may be arranged to flow into the plane of FIG. 1 by changing the positions of the sources and drains.

Figure 3:
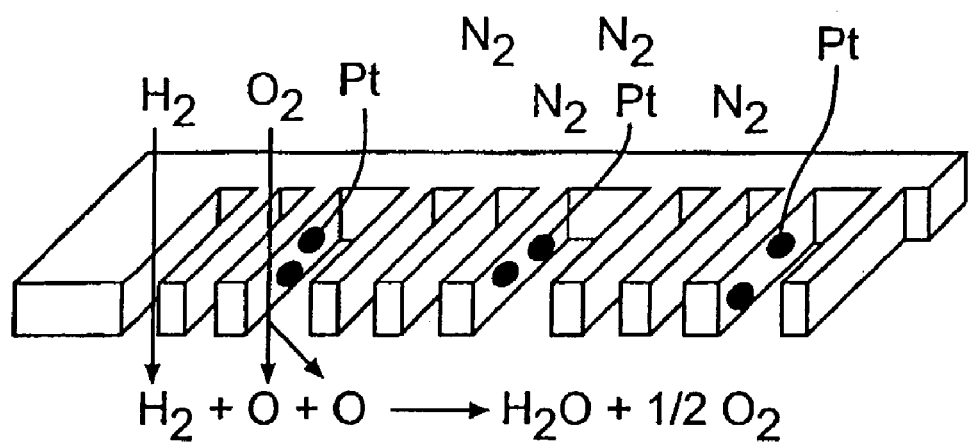
FIG. 3 illustrates an active membrane filter of the present invention in simplified form.

The present invention also provides nano-sized reaction chambers for carrying out chemical reactions, such as the reactions that may take place in an active filter. For example, a thin segment of a (5 5 12) or other (1 1 X) Si wafer may be used to form water from even very dry air using the small mole fraction of about $5 \times 10^{-6}$ of $H_2$ gas in the atmosphere. This $H_2$ gas is allowed to pass through a narrow nanowindow in the filter and $O_2$ is allowed to pass, and perhaps dissociate due to a Pt catalyst on the walls of the filter, through a wider neighboring gap. Then the $H_2$ and the excited oxygen atoms recombine on the downside of the filter to form water, as shown in FIG. 3. Nanowindows of different widths may be formed on Si(5 5 12) by near grazing incidence evaporation onto the tops of the pi-chain ridges that make up the (5 5 12) unit cell. These atomic ridges have spacings of 1.6, 1.6, and 2.2 nm within the 5.4 nm unit cells of the (5 5 12). These spacings provide two different spacings of the nanoridges of 1.6 and 2.2 nm. The grooves between these ridges are typically 0.6 smaller than the spacings of the nanoridges, so neighboring nanowindows are about 1.0 and 1.6 nm wide after the dry etching process, as shown in FIG. 3. However, if narrower nanowindows are desired to encourage particular chemical reactions, the ridges may be oxidized and the resulting window widths will be about 0.4 and 1.0 nm wide. Many other options exist using these general principles.

The active filter shown in FIG. 3 may be used for oxygen enrichment of normal air. For example, if the $O_2$ dissociates in a small groove perhaps due to the presence of a catalyst such as Pt on the walls of the grooves, as shown in FIG. 3 and the $N_2$ in the air sample does not dissociate, then the $O_2$ will effectively move much more efficiently through the filter since it is much smaller while it is passing through the structure, but it almost instantly recombines on the downside of the active filter. Such an active filter may be used in a mask for placing on an individual's face. Alternatively, the filter may be used in some other oxygen delivery system to replace the large oxygen tank typically used by individuals with oxygen deficits.

To prevent $H_2O$ vapor from plugging the active filter of the present invention, the formation of $SiO_2$ may be inhibited by using an H-passivation process on the Si filter. One method of H-passivation is to soak the filter in a dilute solution of HF, preferably stabilized with F-compounds and/or by Pt or other catalyst(s).

The active filter may also be used to form $H_2$ by passing normal water vapor form the atmosphere through the grooves and forming $H_2$ and perhaps singlet excited oxygen on the down side using a suitable catalyst on the walls of the filter, as shown in FIG. 3. The $H_2$ so formed may be used in a fuel cell without the need for any bulky $H_2$ storage process. A preferred catalyst is Pt.

$H_2$ may also be formed by the diffusion of singlet $H^+$ ions from a dense plasma through the active filter of FIG. 3 by the reaction $H^+ + H^+ + 2e^- \rightarrow H_2$. This reaction proceeds extremely rapidly, with an estimated turnover rate of about $2 \times 10^5$ molecules/sec inside a filter containing single channel wall thicknesses of about 0.3 nm (rather than the double channel wall thicknesses of 0.6 nm of the oxygen enriching filter.) This turnover rate is faster than most inorganic catalytic process by a factor of 1000 or so, and is within a factor of 5 of perhaps the fastest rates known, namely the hydgrogenase reactions for converting $H^+$ ions into molecular $H_2$ in the human body. This very fast turnover rate is due to the extremely thin vertical membranes on the (1 1 2) or other (1 1 X) surfaces in conjunction with the rapid diffusion of H in Si. A Pt or other catalyst on the surface of the vertical membranes may be used to ensure rapid recombination of H ions (protons) to form molecular hydrogen. Because two electrons must be extracted from the Si for every molecule of $H_2$ that is formed, a very large current density of about 56 A/cm$^2$ results from this process. This large current flow may in principle be drained off the membrane to ground as the plasma moves through the membrane.

Figure 4:
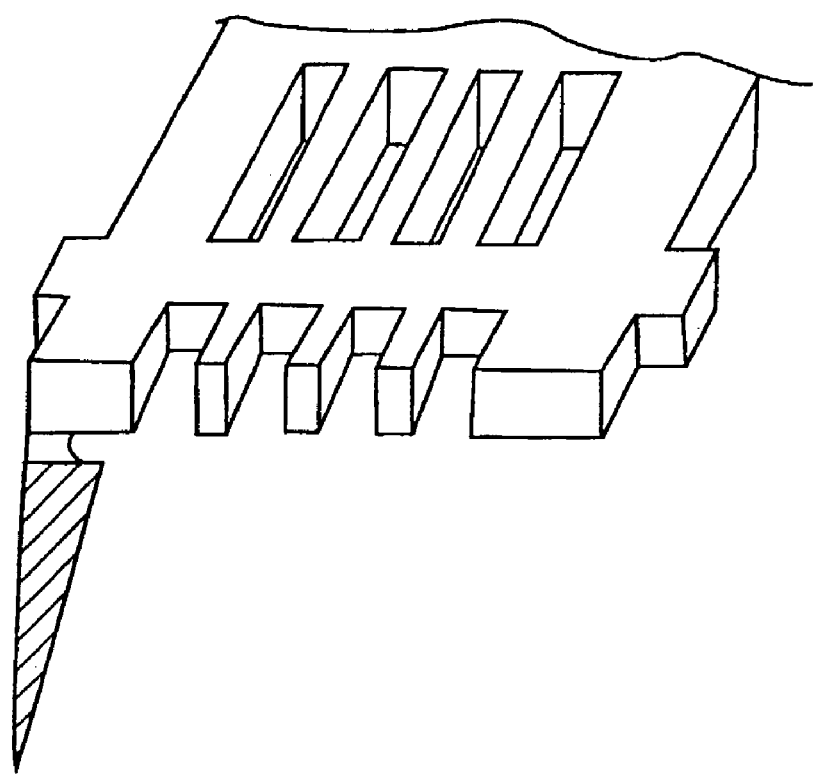
FIG. 4 is a cross-sectional illustration of an e-beam mask of the present invention

The present invention also provides a nanometer size electron beam litho-mask. Lithographic processes currently being developed, such as SCALPEL (scattering with angular limitation projection electron-beam lithography), may have an ultimate minimum dimension of 35 nm. In contrast, the litho-mask of the present invention may have a resolution of a small as 2 nm with a pitch at least as small as 5 nm. FIG. 4 illustrates a litho mask that may be used as a contact mask for e-beam lithography.

The litho masks or membranes of the present invention may be made in a series of steps. First, depression patterning is performed on the substrate, which preferably comprises Si. Light assisted chemical etch (LACE) process, an E-beam process, or Focused Ion Beam/Gas Assisted Etching (FIB/GAE), may be performed to produce convex regions at desired locations in the depression patterning process.

Figure 5:
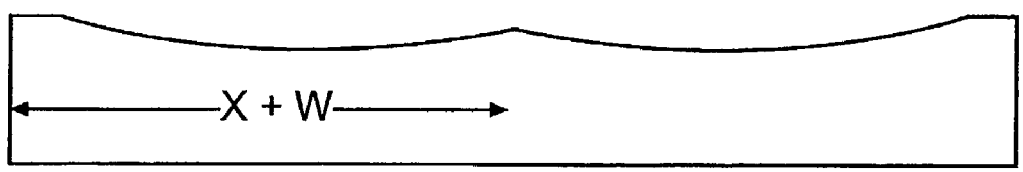
FIG. 5 is a simplified cross-sectional illustration of a depression patterning step of one embodiment of the method of the present invention for forming a membrane.

Depression patterning may also be done using a chemical etching process along the lines described in U.S. patent application Ser. No. 09/187,730, the entire contents and disclosure of which is hereby incorporated by reference. Any of these localized etching process may be followed by a brief Chem-Mechanical Polish (CMP) touch up process, if desired. FIG. 5 illustrates a depression patterning step of one embodiment of the present invention.

Figure 6:
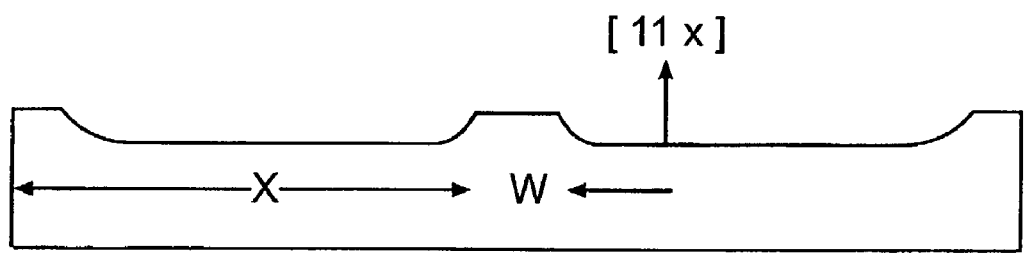
FIG. 6 is a simplified cross-sectional illustration of a crystal flattening step of one embodiment of the method of the present invention for forming a membrane.

The convex regions of the treated substrate may then be conditioned to be atomically flat (1 1 X) over tens of microns using Ar ion bombardment at 800 to 975° C. for 1 to 5 minutes, or by allowing molecular oxygen to impinge on the surface at a pressure of about $4 \times 10^{-8}$ torr at 800 to 975 C for 1 to 5 minutes; see J. B. Hannon, et al, Phys. Rev. Lett. 81,4676–4681 (1998). Another way to condition the convex regions to make them atomically flat is to heat the substrate in ultrahigh vacuum (UHV) at about 1150 to 1200° C. for several hours; see s. Tanaka, et al, Appl. Phys. Lett. 69, 1235–1237 (1996). However, using a process having an operating temperature less than 975° C. is preferred in most cases to avoid plastic deformation of Si. FIG. 6 illustrates such a conditioning (atomic flattening) step of one embodiment of the present invention.

Figure 7:
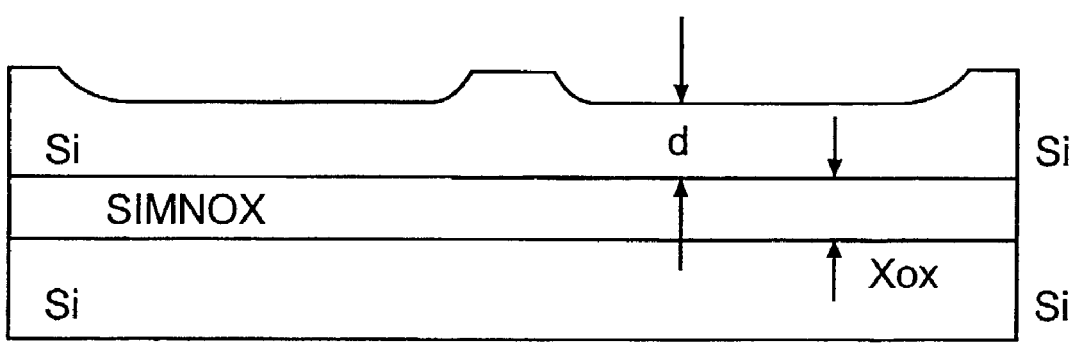
FIG. 7 is a simplified cross-sectional illustration of oxygen and nitrogen implantation step of one embodiment of the method of the present invention for forming a membrane.

In order to make a very thin e-beam mask or membrane, a low energy implantation of oxygen, nitrogen, or a mixture of oxygen and nitrogen is conducted on the substrate. This SIMNOX or SIMOX treatment is preferably conducted at an elevated temperature at a dose of about $10^{-18}/cm^2$. The substrate is then heated to a still higher temperature, such as 1050 to 1200° C. to form the oxide, nitride, or oxy-nitride under the surface of the (1 1 X) Si, while leaving the top thin layer single crystalline, thereby forming a multi-layer wafer. One advantage of the "Separation by Implantation with Nitrogen and Oxygen" (SIMNOX) using silicon nitride or silicon oxynitride is that the underlying layer will be in tension to cause the ultimate ultra-thin mask to be stretched flat rather than be severely wrinkled as it would be with a silicon oxide (SIMOX) film. FIG. 7 illustrates the results of an N and O implantation step of one embodiment of the present invention. An early description of the so-called SIMOX or SIMNOX process for producing either an oxide or an oxynitride layer, respectively, under a single crystal Si layer is U.S. Pat. No. 3,807,274 to Kendall et al., the entire contents and disclosure of which is hereby incorporated by reference.

It should be noted that the SIMNOX or SIMOX treatment described above may be performed before depression patterning with similar results. In fact, the top of the dielectric film produced may be somewhat smoother if the implantation is done before depression patterning.

Figure 8:
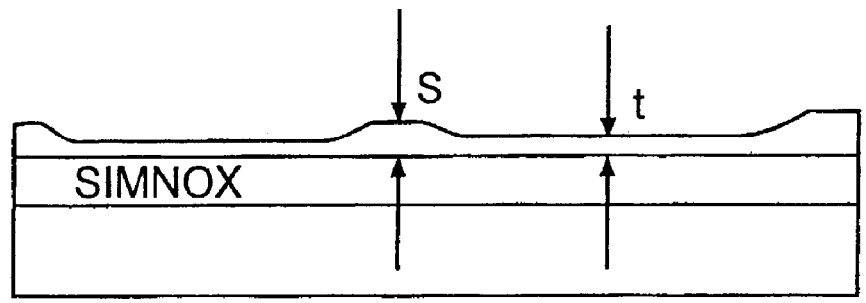
FIG. 8 is a simplified cross-sectional illustration of a layer thinning step of one embodiment of the method of the present invention for forming a membrane.

The single crystal layer produced by the implantation process described above will preferably have a thickness of about 0.1 to 0.5 μm. To produce particularly thin grooves from this single crystal layer, the upper layer of Si must be thinned down to about 5.0 to 50.0 nm. This thinning may be accomplished by oxidation in $O_2$ at a temperature of 800 to 900° C. followed by dipping of the multi-layer wafer in dilute HF or Buffered Oxide Etch (BOE). The thinning of the upper Si layer may also be accomplished by either wet or dry etching. However, oxidation and anodization processes are preferred to provide more uniform layer removal. FIG. 8 illustrates the results of a thinning step of one embodiment of the present invention.

The process of thinning the substrate may be performed prior to depression patterning if implantation of oxygen, nitrogen or a mixture thereof is conducted prior to depression patterning.

Figure 9:
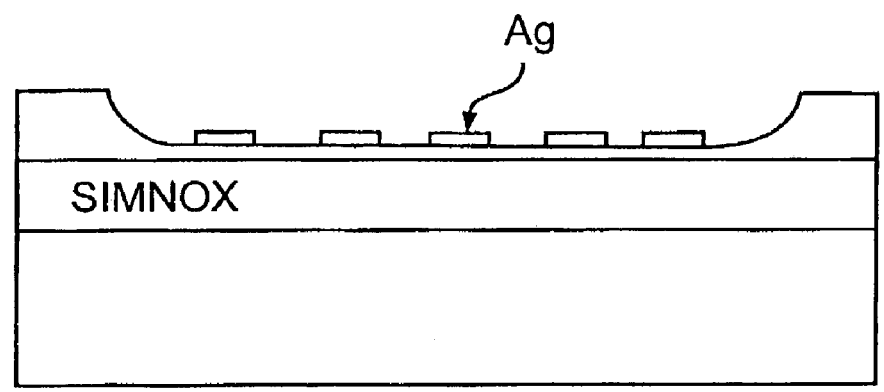
FIG. 9 is a simplified cross-sectional illustration of a nanowire deposition step of one embodiment of the method of the present invention for forming a membrane.

Ag nanowires is then deposited under UHV on the (5 5 12) multi-layer wafer with 5.4 nm pitch in 1.6 nm wide parallel nanowires. The process of deposition preferably includes depositing Ag nanowires having a thickness of 0.25 ML to 2.5 ML at a temperature of 20° C. up to 150° C. After deposition, a heat treatment step is performed in which the multi-layer wafer with the very thin layer of deposited Ag is heated at a temperature up to 450° C. FIG. 9 illustrates the results of a nanowire deposition step of one embodiment of the present invention, where the vertical scale has been increased slightly for clarity.

Figure 10:
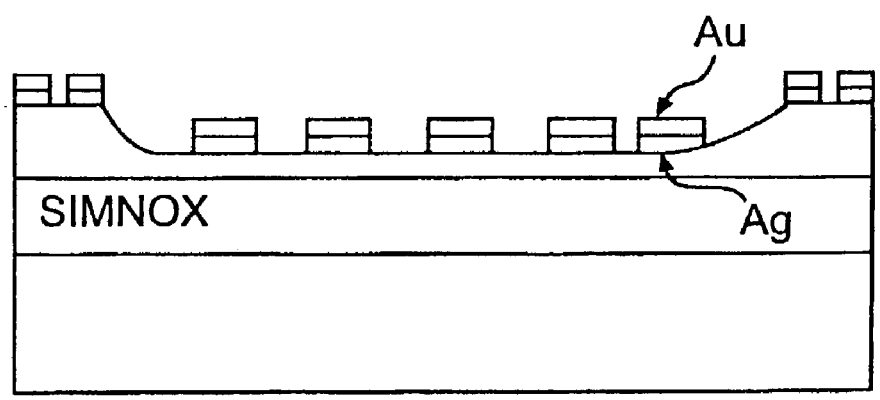
FIG. 10 is a simplified cross-sectional illustration of a nanowire thickening step of one embodiment of the method of the present invention for forming a membrane.

If a thicker more robust membrane or etch mask is required, a Au deposition of 0.20 to 5 ML or more may be applied at a temperature of 200 to 350° C. The Au will have a strong tendency to collect only at the position of the Ag strips due to Au's high surface diffusion coefficient on the Si surface, and, possibly due to the less-than-unity sticking coefficient for Au at 200 to 350° C. FIG. 10 illustrates this Au thickening step of one embodiment of the present invention.

Figure 11:
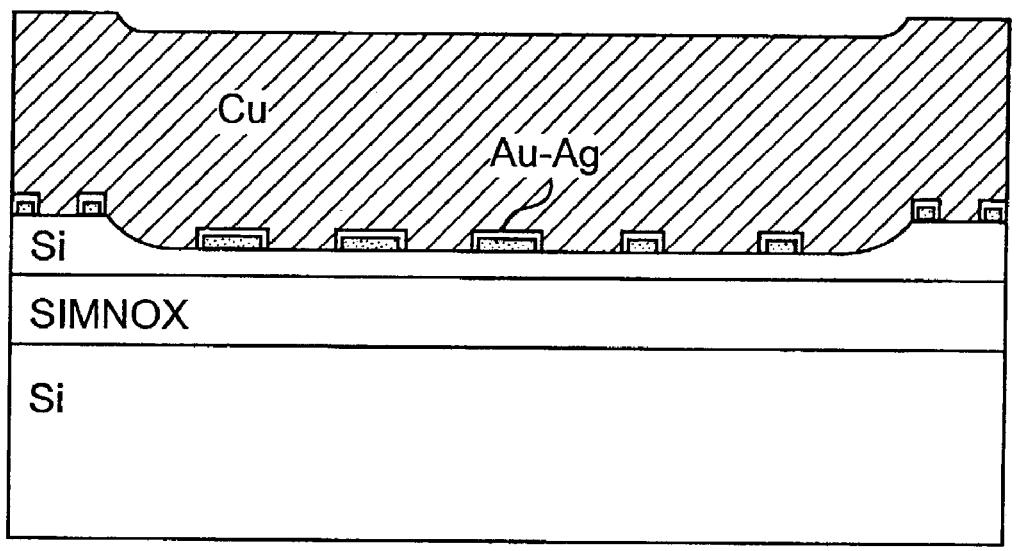
FIG. 11 is a simplified cross-sectional illustration of a copper covering layer step of one embodiment of the method of the present invention for forming a membrane.

If the multi-layer wafer of the present invention with deposited Ag nanowires or thickened Au/Ag nanowires is to be removed from the vacuum, a 5.0 to 50.0 nm thick layer of Cu may be evaporated, preferably at near normal incidence, on top of either the Ag nanowires or the thickened Au/Ag nanowires, respectively, without breaking the vacuum of the UHV system. Coating the nanowires with Cu allows for the samples to be removed form the UHV system and stored at room temperature for long periods of time without oxidation. Such a Cu coating also makes the nanowires resistant to airborne and liquid particle attachment. The Cu may be readily removed using dilute HCl or other known solvents for Cu that will not attack the Au or Ag layers. FIG. 11 illustrates a Cu covering layer step of one embodiment of the present invention.

Figure 12:
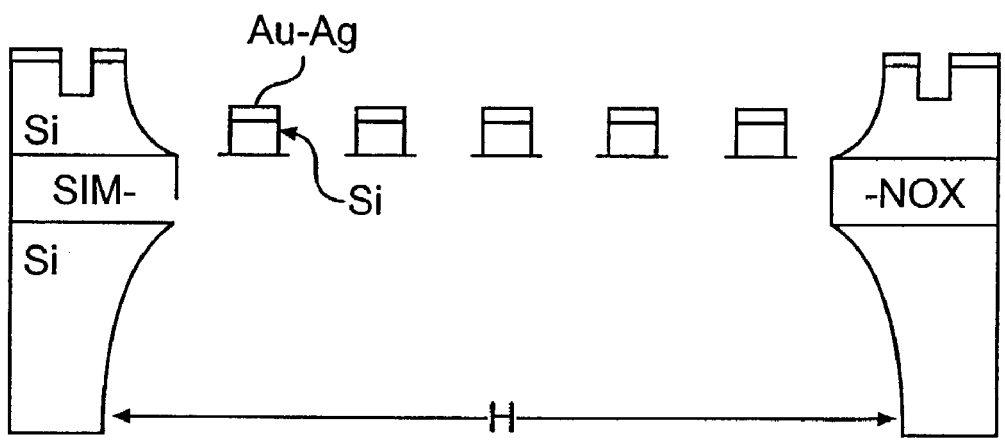
FIG. 12 is a simplified cross-sectional illustration of a nanowindow etching step of one embodiment of the method of the present invention for forming a membrane.

The resulting nanowire multi-layer wafers may then be dry etched, wet etched, chemically etched, or electrochemically etched to provide nanowindows in a thin membrane as shown in FIG. 12. In the embodiment shown in FIG. 12, the nanowindows are surrounded by Au—Ag—Si nanoborders. However, if the Ag nanowires are not coated with Au during processing, the nanoborders would be Ag—Si nanoborders.

An alternative way to produce a thicker membrane for use as an etch-mask is to evaporate a metal or dielectric film at near-grazing incidence, which will provide an oblique evaporation thickening. If this is done on a rotating substrate that has an existing ridged surface morphology similar to that produced in the methods for forming a mask described above, a distinct columnar structure will be produced.

Vertical columns or ridges at least 10 times as high as the thickness of the Si wafer upon which the columns are deposited by oblique evaporation thickening may be obtained, as shown by Hannon, et al mentioned earlier. So, for example, a 3.4 nm high ridge on a Si (5 5 12) wafer will support a ridge or column of a deposited material at least 34.0 nm high. To remove irregularities, after the oblique evaporation thickening, the Si wafer with thickened ridges or columns may be dipped in a basic solution such as KOH:water or an organic base to straighten out any irregularities in the bombarded walls caused by warped etch masks in the bombarded walls.

Due to the thinness on the etch mask produced by the process of the present invention and the nanowindows therein, the etch mask and nanowindows of the present invention are preferably provided with etched honeycomb supports, such as those described in the U.S. Pat. No.

3,936,329 to Kendall et al., the entire disclosure and contents of which is hereby incorporated by reference.

The etch mask of the present invention may be used for a near-contact e-beam mask with very small patterns. The etch mask of the present invention may also be used for shadow masks for different angle evaporation or different types of energetic particles. In addition, the etch mask of the present invention may used for making MOSFETs with nanometer size features or for making SCALPEL masks more robust and/or more tolerant of angular deviations in an e-beam. The etch mask of the present invention may also be used to make a slightly diverging or converging e-beam into one or more parallel beams.

A surprising and potentially useful feature of the thin membranes of the present invention is that they may be produced by this technology is that the membranes may be heated and cooled in incredibly short times. An estimate of the ultimate cooling time (and heating time) is given by the equation: $\tau_c = C_p d^2 / K$, where $C_p$ is the specific heat, d is the thickness, and K is the thermal conductivity of the membrane material. Using the known values of these parameters for Si, and assuming a thickness of 1.0 μm for simplicity, the ultimate cooling rate is calculated as 70 ns. For the more relevant thinnest membrane above used in this invention of 5 nm, the ultimate cooling rate is about $2 \times 10^{-12}$ s, which is much faster than any switching time of a device in a typical IC. This means that a thin membrane is very sensitive to current and voltage variations while operating as an environmental or flow sensor.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A MOSFET device comprising:
    a substrate including a plurality of atomic ridges, each of said atomic ridges including a semiconductor layer comprising Si and a dielectric layer comprising a Si compound;
    a plurality nanogrooves between said atomic ridges;
    at least one elongated molecule located in at least one of said nanogrooves;
    a porous gate layer located on top of said plurality of atomic ridges.

2. The MOSFET device of claim 1, wherein said atomic ridges have a pitch of about 0.94 to 5.4 nm.

3. The MOSFET device of claim 1, wherein said dielectric layer comprises $SiO_2$.

4. The MOSFET device of claim 1, wherein said at least one elongated molecule comprises a long chain molecule.

5. The MOSFET device of claim 1, wherein said at least one elongated molecule comprises a carbon nanotube.

6. The MOSFET device of claim 5, wherein said MOSFET device includes detecting means for detecting the presence of $NH_3$ and $NO_2$ gas molecules and wherein said detecting means comprises said nanotubes.

7. The MOSFET device of claim 1, wherein said at least one elongated molecule comprises a plurality of elongated molecules located in said plurality of nanogrooves.

8. The MOSFET device of claim 1, wherein said porous gate layer has pores having diameters of 0.8 to 4.0 nm.

9. The MOSFET device of claim 8, wherein said porous gate layer comprises a high conductance metal.

10. The MOSFET device of claim 1, wherein said porous gate layer has pores having diameter of 0.3 to 0.7 nm.

11. The MOSFET device of claim 10, wherein said porous gate layer comprises Au.

12. The MOSFET device of claim 1, wherein said porous gate layer has pores that all are the same diameter to a tolerance of 0.2 nm.

13. The MOSFET device of claim 1, wherein said porous gate layer includes pores that differ in diameter by at least 0.7 nm.

* * * * *